US009059058B2

(12) United States Patent
Teysseyre et al.

(10) Patent No.: US 9,059,058 B2
(45) Date of Patent: Jun. 16, 2015

(54) IMAGE SENSOR DEVICE WITH IR FILTER AND RELATED METHODS

(71) Applicant: STMICROELECTRONICS ASIA PACIFIC PTE LTD (SINGAPORE), Singapore (SG)

(72) Inventors: Jerome Teysseyre, Ang Mo Kio (SG); Yonggang Jin, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 425 days.

(21) Appl. No.: 13/656,912

(22) Filed: Oct. 22, 2012

(65) Prior Publication Data
US 2014/0110565 A1   Apr. 24, 2014

(51) Int. Cl.
*H01L 27/146* (2006.01)
*H01L 31/18* (2006.01)

(52) U.S. Cl.
CPC .... *H01L 27/14625* (2013.01); *H01L 27/14618* (2013.01)

(58) Field of Classification Search
CPC .................................................. H01L 27/14625
USPC ................. 250/208.1; 348/340; 257/290–292
See application file for complete search history.

(56) References Cited

U.S. PATENT DOCUMENTS

| | | | |
|---|---|---|---|
| 6,737,879 B2 | 5/2004 | Johnson | |
| 6,845,554 B2 | 1/2005 | Frankowsky et al. | |
| 7,276,783 B2 | 10/2007 | Goller et al. | |
| 7,517,722 B2 | 4/2009 | Goller et al. | |
| 7,759,167 B2 | 7/2010 | Vanfleteren et al. | |
| 7,911,068 B2 | 3/2011 | Meyer et al. | |
| 8,119,454 B2 | 2/2012 | Jin | |
| 8,153,458 B2 | 4/2012 | Weng et al. | |
| 8,227,927 B2 | 7/2012 | Chen et al. | |
| 8,236,608 B2 | 8/2012 | Yang | |
| 2005/0124093 A1 | 6/2005 | Yang et al. | |
| 2006/0001761 A1* | 1/2006 | Haba et al. | 348/340 |
| 2007/0123058 A1* | 5/2007 | Farnworth et al. | 438/780 |
| 2007/0259517 A1* | 11/2007 | Benson et al. | 438/618 |
| 2008/0170296 A1 | 7/2008 | Chaves et al. | |
| 2008/0173792 A1 | 7/2008 | Yang et al. | |
| 2008/0211075 A1 | 9/2008 | Yang et al. | |
| 2008/0224248 A1 | 9/2008 | Yang et al. | |
| 2008/0237766 A1* | 10/2008 | Kim | 257/432 |
| 2008/0274579 A1 | 11/2008 | Yang et al. | |
| 2008/0277799 A1* | 11/2008 | Benson et al. | 257/774 |
| 2008/0290438 A1 | 11/2008 | Weng et al. | |
| 2009/0057544 A1 | 3/2009 | Brodie et al. | |
| 2009/0181490 A1 | 7/2009 | Weng et al. | |
| 2011/0068485 A1 | 3/2011 | Meyer et al. | |
| 2011/0157452 A1 | 6/2011 | Goh et al. | |
| 2011/0249111 A1 | 10/2011 | Weiss et al. | |
| 2012/0104625 A1 | 5/2012 | Park et al. | |

* cited by examiner

*Primary Examiner* — Seung C Sohn
(74) *Attorney, Agent, or Firm* — Allen, Dyer, Doppelt, Milbrath & Gilchrist, P.A.

(57) ABSTRACT

An image sensor device may include a bottom interconnect layer, an image sensing IC above the bottom interconnect layer and coupled thereto, and an adhesive material on the image sensing IC. The image sensor device may include an IR filter layer above the lens layer, and an encapsulation material on the bottom interconnect layer and surrounding the image sensing IC, the lens layer, and the IR filter layer. The image sensor device may include a top contact layer above the encapsulation material and including a dielectric layer, and a contact thereon, the dielectric layer being flush with adjacent portions of the IR filter layer.

25 Claims, 3 Drawing Sheets

IMAGE SENSOR DEVICE WITH IR FILTER AND RELATED METHODS

FIELD OF THE DISCLOSURE

The present disclosure relates to the field of electronic device manufacturing, and, more particularly, to image sensors and related methods.

BACKGROUND

Typically, electronic devices include one or more camera modules for providing enhanced media functionality. For example, the typical electronic device may utilize the camera modules for photo capturing and video teleconferencing. In the typical electronic device with multiple camera modules, the primary camera module has a high pixel density and an adjustable focus lens system, while the secondary camera module is front-facing and has a lower pixel density. Also, the secondary camera module may have a fixed focus lens system.

For example, U.S. Patent Application No. 2009/0057544 to Brodie et al, assigned to the present application's assignee, discloses a camera module for a mobile device. The camera module comprises a lens, a housing carrying the lens, and a lens cap over the lens and housing. The camera module includes a barrel mechanism for adjusting the lens. During manufacture of an electronic device including one or more camera modules, there is a desire to manufacture the electronic device as quickly as possible, particularly in mass production runs.

The typical camera module is manufactured in a multi-step process. The first steps include semiconductor processing to provide the image sensor integrated circuit (IC). The next steps include some form of testing for the image sensor IC and packaging. The image sensor IC may be assembled into the camera module, along with a lens and movable barrel if needed. This assembly of the camera module may be performed manually or via machine. For example, in electronic devices that use surface mounted components, a pick-and-place (PNP) machine may assemble the components onto a printed circuit board (PCB). A drawback to such singular packaging is that it may be relatively inefficient and also may require that each device be tested individually, adding to the manufacturing time.

In some applications, it may helpful to manufacture the image sensor IC to include an infrared (IR) filter glass. In one approach, an IR filtering glass is attached over the image sensor IC. A potential drawback to this approach is that the overall thickness of the device may be increased, which may be undesirable for tight fitted mobile applications.

SUMMARY

In view of the foregoing background, it is therefore an object of the present disclosure to provide an image sensor device that is thin and readily manufactured.

This and other objects, features, and advantages in accordance with the present disclosure are provided by an image sensor device that may comprise a bottom interconnect layer, an image sensing IC above the bottom interconnect layer and coupled thereto, and an adhesive material on the image sensing IC and defining a recess above the image sensing IC. The image sensor device may also include an infrared (IR) filter layer above the recess, and an encapsulation material on the bottom interconnect layer and surrounding the image sensing IC, the recess, and the IR filter layer. The image sensor device may include a top contact layer above the encapsulation material and including a dielectric layer, and a contact thereon, the dielectric layer being flush with adjacent portions of the IR filter layer. Advantageously, the IR filter layer may have a reduced thickness.

In some embodiments, the image sensing IC may have a sensing surface adjacent the recess and opposite the bottom interconnect layer. The image sensing IC may comprise a semiconductor substrate, and at least one electrically conductive via extending therethrough and coupled to the bottom interconnect layer. In other embodiments, the image sensing IC may have a sensing surface adjacent the bottom interconnect layer and opposite the recess.

The bottom interconnect layer may comprise a plurality of dielectric layers and a plurality of electrically conductive layers associated therewith. The image sensor device may further comprise a plurality of bottom contacts carried by the bottom interconnect layer. The image sensor device may also include at least one electrically conductive via extending through the encapsulation material and coupled to the at least one contact.

The image sensor device may further comprise a lens module above the IR filter layer and coupled to the at least one contact. The image sensor device may also include an adhesive material between the image sensing IC and the IR filter layer, and surrounding the recess. For example, the IR filter layer may comprise an IR filter glass layer.

Another aspect is directed to a method for making an image sensor device. The method may comprise positioning an adhesive material on the image sensing IC and defining a recess above an image sensing IC, positioning an IR filter layer above the recess, and forming an encapsulation material surrounding the image sensing IC, the recess, and the IR filter layer. The method may also include forming a bottom interconnect layer on the image sensing IC and adjacent portions of the encapsulation material.

DETAILED DESCRIPTION OF THE EMBODIMENTS

The present embodiments will now be described more fully hereinafter with reference to the accompanying drawings, in which preferred embodiments are shown. This present disclosure may, however, be embodied in many different forms and should not be construed as limited to the embodiments set forth herein. Rather, these embodiments are provided so that this disclosure will be thorough and complete, and will fully convey the scope of the present embodiments to those skilled in the art. Like numbers refer to like elements throughout, and prime notation is used to indicate similar elements in alternative embodiments.

Figure 1:
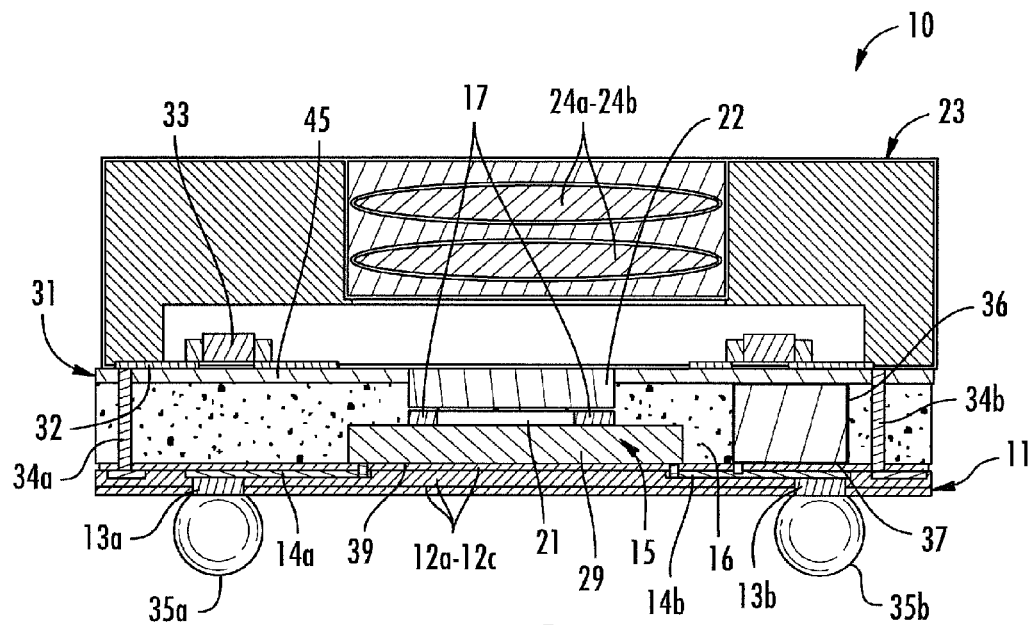
FIG. 1 is a cross-section view of an image sensor device, according to the present disclosure.

Referring to FIG. 1, an image sensor device 10 according to the present disclosure is now described. The image sensor device 10 illustratively includes a bottom interconnect layer 11, an image sensing IC 15 above the bottom interconnect layer and coupled thereto, and an adhesive material 17 on the image sensing IC and defining a recess (or cavity) 21 above the image sensing IC. The image sensor device 10 illustratively includes an IR filter layer 22 above the recess 21, and an encapsulation material 16 on the bottom interconnect layer 11 and surrounding the image sensing IC 15, the recess, and the IR filter layer.

For example, the IR filter layer 22 may comprise an IR filter glass layer, such as a glass layer with an IR filtering coating thereon. In other embodiments, the glass layer may be formed of a compound transparent to other wavelengths of electromagnetic radiation, but opaque to IR radiation. In other words, the IR filtering characteristic is provided by the glass material and is intrinsic thereto. It should be noted that the IR filter layer 22 has a reduced width as compared to prior art approaches. In particular, the IR filter layer 22 has a width near equal with the width of the sensing surface 39 and less than the width of the image sensing IC 15. Also, in some embodiments, the recess 21 may comprise a micro lens.

In the illustrated embodiment, the image sensing IC 15 illustratively includes a sensing surface 39 adjacent the bottom interconnect layer 11 and opposite the recess 21. In other words, this embodiment is a backside illumination type image sensor device. Also, the image sensing IC 15 illustratively includes a micro lens (not shown) on the sensing surface 39.

The bottom interconnect layer 11 illustratively includes a plurality of dielectric layers 12a-12c and a plurality of electrically conductive layers 14a-14b associated therewith. The image sensor device 10 illustratively includes a plurality of bottom contacts 35a-35b carried by the bottom interconnect layer 11. Also, the bottom interconnect layer 11 illustratively includes a plurality of electrically conductive vias 13a-13b extending therethrough and coupling the electrically conductive layers 14a-14b to the bottom contacts 35a-35b.

Additionally, the image sensor device 10 illustratively includes a top contact layer 31 above the encapsulation material 16 and comprising a dielectric layer 45 and a plurality of contacts 33 thereon. The dielectric layer 45 is flush with adjacent portions of the IR filter layer 22. In other words, the IR filter layer 22 is embedded into the encapsulation material 16. The image sensor device 10 illustratively includes a plurality of electrically conductive vias 34a-34b extending through the encapsulation material 16 and coupled to the contacts 33.

The image sensor device 10 illustratively includes a lens module 23 above the IR filter layer 22 and coupled to the contacts 33. For example, the contacts 33 may provide electrical connections to drive the lens module 23 or other electrical components. The lens module 23 illustratively includes a lens barrel, and a plurality of lenses 24a-24b coupled to the lens barrel. The lens module may also include an actuator (not shown) for positioning the lenses 24a-24b within the lens barrel. The image sensor device 10 illustratively includes an adhesive material 17 between the image sensing IC 15 and the IR filter layer 22, and surrounding the recess 21. The image sensor device 10 illustratively includes a lens portion 36, and an IC 37 under the lens portion.

Figure 2:
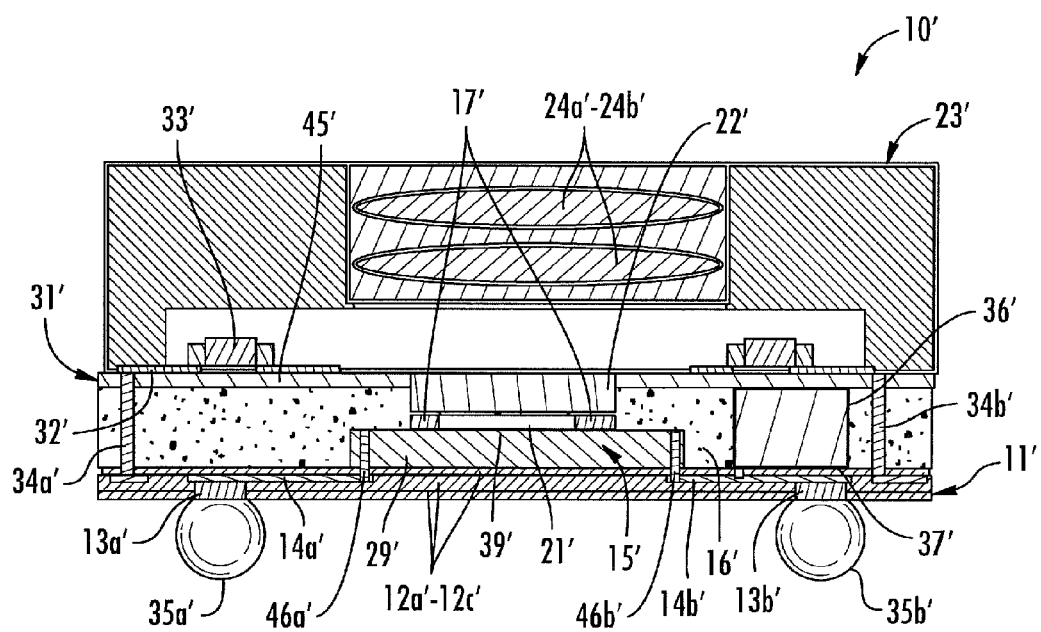
FIG. 2 is a cross-section view of another embodiment of an image sensor device, according to the present disclosure.

Referring now to FIG. 2, another embodiment of the image sensor device 10' is now described. In this embodiment of the image sensor device 10', those elements already discussed above with respect to FIG. 1 are given prime notation and most require no further discussion herein. This embodiment differs from the previous embodiment in that the image sensing IC 15' illustratively includes a sensing surface 39' adjacent the recess 21' and opposite the bottom interconnect layer 11'. In other words, this image sensor device 10' is a front side illumination image sensor device. The image sensing IC 15' illustratively includes a semiconductor substrate 29', and a plurality of electrically conductive through-vias 46a'-46b' extending therethrough and coupled to the bottom interconnect layer 11'. For example, the semiconductor substrate 29' may comprise a through silicon via (TSV) substrate.

Another aspect is directed to a method for making an image sensor device 10. The method may comprise positioning a recess 21 above an image sensing IC 15, positioning an IR filter layer 22 above the recess, and forming an encapsulation material 16 surrounding the image sensing IC, the recess, and the IR filter layer. The method may also include forming a bottom interconnect layer 11 on the image sensing IC 15 and adjacent portions of the encapsulation material 16.

Figure 3:
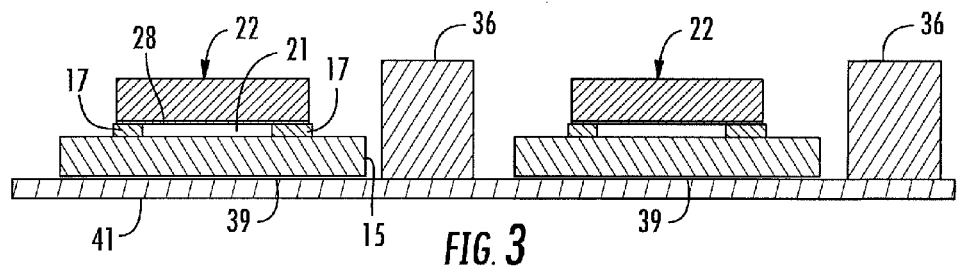
FIGS. 3-5 are cross-section views of steps for forming the image sensor device of FIG. 1.
Figure 4:
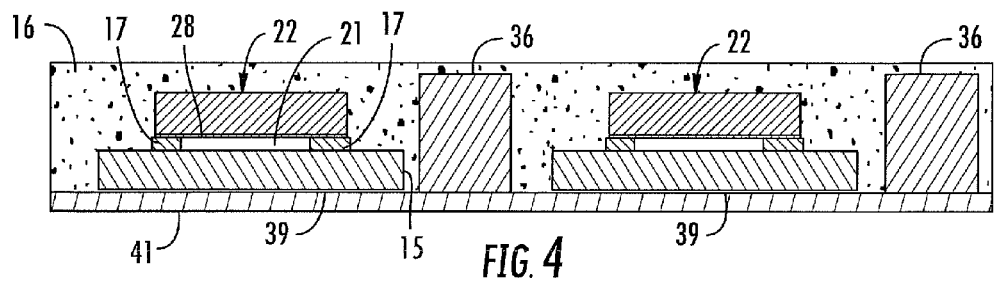
Figure 5:
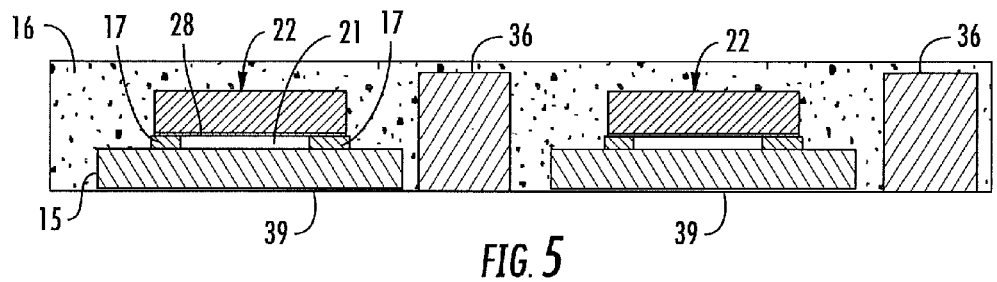

Referring now additionally to FIGS. 3-5, a method of making a plurality of the image sensor devices 10a-10b is now described. The method illustratively includes positioning the image sensing IC 15, the recess 21, and the IR filter layer 22 as one single package on a carrier tape layer 41. Of course, in this embodiment, the image sensing surface 39 of the image sensing IC 15 is placed facedown, i.e. facing the carrier tape layer 41 (the backside illumination embodiment of FIG. 1). As will be appreciated by those skilled in the art, the method for making the front side embodiment (FIG. 2) will require a flipping of the image sensing IC 15 and the forming of electrically conductive vias through the substrate 29 of the image sensing IC 15.

The single package is coupled together with the adhesive 17, and may be placed easily and readily using a PNP device. As illustrated, the method provides for the making multiple image sensor devices 10a-10b at the same time using a wafer level process (WLP). Also, the IR filter layer 22 illustratively includes a thin IR layer 28 adjacent the recess 21. For example, the IR layer 28 may comprise a coating or a resilient layer attached to glass layer base. The method illustratively includes forming the encapsulation material 16 on the carrier tape layer 41, and removing the carrier taper layer.

Figure 6:
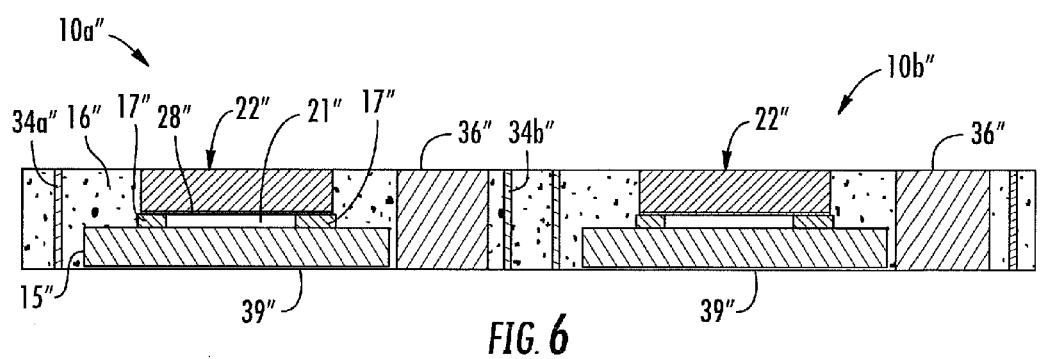
FIGS. 6-7 are cross-section views of another embodiment of additional steps for making an image sensor device, according to the present disclosure.
Figure 7:
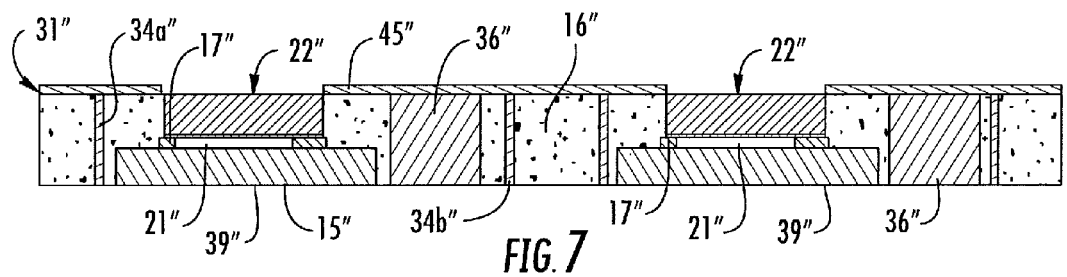

Referring now to FIGS. 6-7, the method also illustratively includes forming the electrically conductive vias 34a"-34b" in the encapsulation material 16". In this embodiment of the method, those elements already discussed above with respect to FIGS. 3-5 are given double prime notation and most require no further discussion herein. This embodiment differs from the previous embodiment in that the spacing between adjacent image sensor devices 10a"-10b" has increased. For example, the electrically conductive vias 34a"-34b" may be formed by first drilling or laser etching, for example, a via, and subsequently filling the via with electrically conductive material with a deposition process.

The method also includes forming the dielectric layers, and electrically conductive layers on both sides of the encapsulation material 16" to define the bottom interconnect layer 11" and the top contact layer 31". The dielectric layers may be formed during a passivation process, for example.

Figure 8:
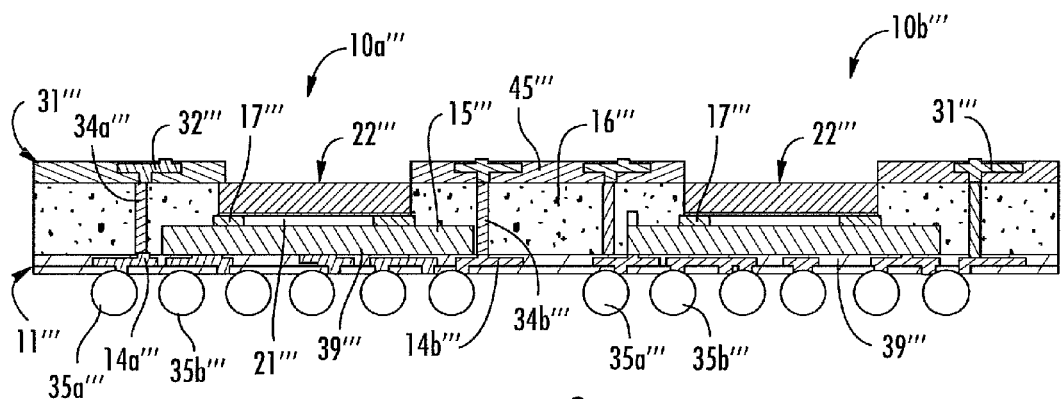
FIG. 8 is a cross-section view of another embodiment of an additional step for making an image sensor device, according to the present disclosure.

Referring now to FIG. 8, the method also illustratively includes forming a plurality of bottom contacts 35a'''-35b''' on the bottom interconnect layer 11'''. In this embodiment of the method, those elements already discussed above with respect to FIGS. 3-7 are given triple prime notation and most require no further discussion herein. This embodiment differs from the previous embodiment in that the lens portions are omitted. Also, in this illustrated embodiment, the bottom contacts 35a'''-35b''' comprise ball grid array contacts.

Figure 9:
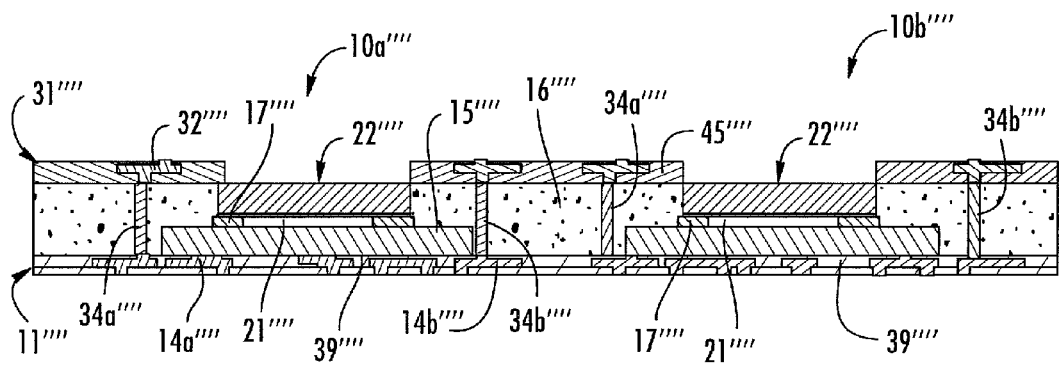
FIG. 9 is a cross-section view of another embodiment of the step of FIG. 8, according to the present disclosure.

Referring now to FIG. 9, another embodiment of the method is shown. In this embodiment of the method, those elements already discussed above with respect to FIGS. 3-8 are given quadruple prime notation and most require no further discussion herein. This embodiment differs from the previous embodiment in that the forming of the bottom contacts 35a''''-35b'''' has been omitted.

Advantageously, the image sensor devices 10a-10b have a reduced thickness as compared to the typical image sensor device. This is largely due to the single package approach of the IR filter layer 22. In particular, the IR filter layer 22 may have a thickness of 250 microns, as compared to the 500 micron thickness of the typical coating based filter.

Other features of image sensor devices may be found in related U.S. application Ser. No. 13/485,624, the contents of which are incorporated by reference in their entirety.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An image sensor device comprising:
a bottom interconnect layer;
an image sensing integrated circuit (IC) above said bottom interconnect layer and coupled thereto;
an adhesive material on said image sensing IC;
an infrared (IR) filter layer above said image sensing IC;
an encapsulation material on said bottom interconnect layer and surrounding said image sensing IC, and said IR filter layer; and
a top contact layer above said encapsulation material and comprising a dielectric layer, and at least one contact thereon, said dielectric layer being flush with adjacent portions of said IR filter layer.

2. The image sensor device of claim 1 wherein said adhesive material defines a recess above said image sensing IC; wherein said IR filer layer is also above the recess; and wherein said encapsulation material surrounds the recess.

3. The image sensor device of claim 2 wherein said image sensing IC has a sensing surface adjacent said recess and opposite said bottom interconnect layer.

4. The image sensor device of claim 3 wherein said image sensing IC comprises a semiconductor substrate, and at least one electrically conductive via extending therethrough and coupled to said bottom interconnect layer.

5. The image sensor device of claim 2 wherein said image sensing IC has a sensing surface adjacent said bottom interconnect layer and opposite said recess.

6. The image sensor device of claim 1 wherein said bottom interconnect layer comprises a plurality of dielectric layers and a plurality of electrically conductive layers associated therewith.

7. The image sensor device of claim 1 further comprising a plurality of bottom contacts carried by said bottom interconnect layer.

8. The image sensor device of claim 1 further comprising at least one electrically conductive via extending through said encapsulation material and coupled to said at least one contact.

9. The image sensor device of claim 8 further comprising a lens module above said IR filter layer and coupled to said at least one contact.

10. The image sensor device of claim 1 wherein said IR filter layer comprises an IR filter glass layer.

11. An image sensor device comprising:
a bottom interconnect layer;
an image sensing integrated circuit (IC) above said bottom interconnect layer and coupled thereto;
an adhesive material on said image sensing IC and defining a recess above said image sensing IC;
an infrared (IR) filter glass layer above said recess;
an encapsulation material on said bottom interconnect layer and surrounding said image sensing IC, said recess and said IR filter glass layer;
said image sensing IC having a sensing surface adjacent said recess and opposite said bottom interconnect layer; and
a top contact layer above said encapsulation material and comprising a dielectric layer, and at least one contact thereon, said dielectric layer being flush with adjacent portions of said IR filter glass layer.

12. The image sensor device of claim 11 wherein said image sensing IC comprises a semiconductor substrate, and at least one electrically conductive via extending therethrough and coupled to said bottom interconnect layer.

13. The image sensor device of claim 11 wherein said bottom interconnect layer comprises a plurality of dielectric layers, and a plurality of electrically conductive layers associated therewith; and further comprising a plurality of bottom contacts carried by said bottom interconnect layer.

14. The image sensor device of claim 11 further comprising at least one electrically conductive via extending through said encapsulation material and coupled to said at least one contact.

15. The image sensor device of claim 14 further comprising a lens module above said IR lens glass layer and coupled to said at least one contact.

16. An image sensor device comprising:
a bottom interconnect layer;
an image sensing integrated circuit (IC) above said bottom interconnect layer and coupled thereto;
an adhesive material on said image sensing IC and defining a recess above said image sensing IC;
an infrared (IR) filter glass layer above said recess; and
an encapsulation material on said bottom interconnect layer and surrounding said image sensing IC, said recess, and said IR filter glass layer;
said image sensing IC having a sensing surface adjacent said bottom interconnect layer and opposite said recess.

17. The image sensor device of claim 16 wherein said bottom interconnect layer comprises a plurality of dielectric layers, and a plurality of electrically conductive layers associated therewith; and further comprising a plurality of bottom contacts carried by said bottom interconnect layer.

18. The image sensor device of claim 16 further comprising a top contact layer above said encapsulation material and comprising a dielectric layer and at least one contact thereon; wherein said dielectric layer is flush with adjacent portions of said IR filter glass layer; and further comprising at least one electrically conductive via extending through said encapsulation material and coupled to said at least one contact.

19. The image sensor device of claim 18 further comprising a lens module above said IR filter glass layer and coupled to said at least one contact.

20. A method for making an image sensor device comprising:

positioning an adhesive material on an image sensing integrated circuit (IC);

positioning an infrared (IR) filter layer above the image sensing IC;

forming an encapsulation material surrounding the image sensing IC, and the IR filter layer;

forming a bottom interconnect layer on the image sensing IC and adjacent portions of the encapsulation material; and forming a top contact layer above the encapsulation material and comprising a dielectric layer, and at least one contact thereon, the dielectric layer being flush with adjacent portions of said IR filter glass layer.

21. The method of claim 20 further comprising positioning the adhesive material on the image sensing IC and defining a recess above the image sensing IC.

22. The method of claim 21 wherein the image sensing IC has a sensing surface adjacent the recess and opposite the bottom interconnect layer.

23. The method of claim 21 wherein the image sensing IC has a sensing surface adjacent the bottom interconnect layer and opposite the recess.

24. The method of claim 20 further comprising forming a plurality of bottom contacts on the bottom interconnect layer.

25. The method of claim 20 further comprising positioning a lens module above the IR filter layer and coupled to the at least one contact.

* * * * *